US011490043B2

United States Patent
Tokunaga

(10) Patent No.: US 11,490,043 B2
(45) Date of Patent: Nov. 1, 2022

(54) IMAGING DEVICE AND CAMERA

(71) Applicant: Panasonic Intellectual Property Management Co., Ltd., Osaka (JP)

(72) Inventor: Yusuke Tokunaga, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 113 days.

(21) Appl. No.: 17/088,692

(22) Filed: Nov. 4, 2020

(65) Prior Publication Data
US 2021/0160449 A1 May 27, 2021

(30) Foreign Application Priority Data

Nov. 26, 2019 (JP) .............................. JP2019-212884

(51) Int. Cl.
*H04N 5/378* (2011.01)
*H04N 5/243* (2006.01)
(Continued)

(52) U.S. Cl.
CPC ....... *H04N 5/378* (2013.01); *H01L 27/14634* (2013.01); *H03M 1/56* (2013.01); *H04N 5/243* (2013.01)

(58) Field of Classification Search
CPC .... H04N 5/243; H04N 5/3575; H04N 5/3658; H04N 5/378; H01L 27/14609; H01L 27/14634; H03M 1/123; H03M 1/56
See application file for complete search history.

(56) References Cited

U.S. PATENT DOCUMENTS 11,146,753 B2 * 10/2021 Shimura ................ H04N 5/378
2007/0008206 A1   1/2007 Tooyama et al.
(Continued)

FOREIGN PATENT DOCUMENTS

JP     2007-019682     1/2007
JP     2014-239289    12/2014
(Continued)

OTHER PUBLICATIONS

Junmou Zhang and E. G. Friedman, "Crosstalk noise model for shielded interconnects in VLSI-based circuits," IEEE International [Systems-on-Chip] SOC Conference, 2003. Proceedings., 2003, pp. 243-244. (Year: 2003).*

(Continued)

*Primary Examiner* — Lin Ye
*Assistant Examiner* — Chriss S Yoder, III
(74) *Attorney, Agent, or Firm* — McDermott Will & Emery LLP

(57) ABSTRACT

An imaging device includes a pixel array, a first converter, a second converter, a first ramp signal generation circuit that is disposed closer to the first converter than to the second converter and supplies a first ramp signal to the first converter and the second converter, a first connection line having one end connected to an output terminal of the first ramp signal generation circuit and including a portion extending away from an input terminal of the first converter in a path from the one end to the other end of the first connection line, and a second connection line having one end connected to the other end of the first connection line and the other end connected to the input terminal and including a portion extending closer to the input terminal in a path from the one end to the other end of the second connection line.

20 Claims, 16 Drawing Sheets

(51) Int. Cl.
*H01L 27/146* (2006.01)
*H03M 1/56* (2006.01)

(56) References Cited

U.S. PATENT DOCUMENTS

| | | |
|---|---|---|
| 2014/0362271 A1 | 12/2014 | Kanagawa |
| 2015/0146063 A1 | 5/2015 | Nishizawa |
| 2016/0021323 A1 | 1/2016 | Aibara |
| 2016/0205333 A1* | 7/2016 | Shishido .............. H04N 5/3658 348/308 |
| 2017/0223292 A1 | 8/2017 | Ikeda et al. |
| 2017/0372168 A1 | 12/2017 | Kobayashi et al. |
| 2019/0104267 A1 | 4/2019 | Kobayashi |

FOREIGN PATENT DOCUMENTS

| | | |
|---|---|---|
| JP | 2015-104021 | 6/2015 |
| JP | 2016-025427 | 2/2016 |
| JP | 2016-213298 | 12/2016 |
| JP | 2018-006880 | 1/2018 |
| JP | 2019-068266 | 4/2019 |
| WO | 2015/079597 | 6/2015 |
| WO | 2016/013413 | 1/2016 |

OTHER PUBLICATIONS

H. Tsugawa et al., "Pixel/DRAM/logic 3-layer stacked CMOS image sensor technology", IEDM2017.

\* cited by examiner

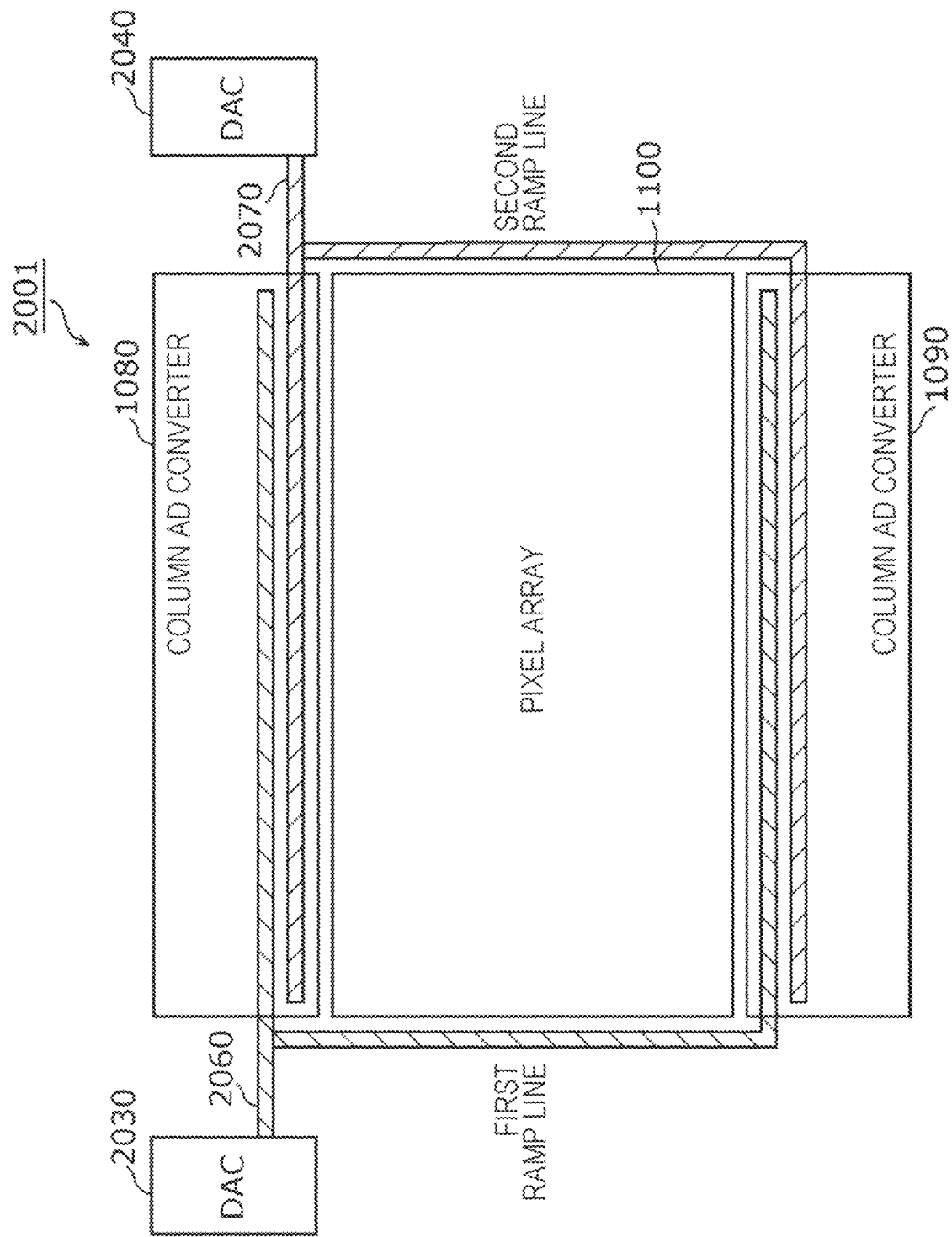

IMAGING DEVICE AND CAMERA

BACKGROUND

1. Technical Field

The present disclosure relates to an imaging device for capturing an image.

2. Description of the Related Art

In most imaging devices equipped with a single-slope analog-to-digital converter (ADC) and, in particular, in large-screen models, an analog-to-digital (AD) converter that AD-converts the output signals of a pixel array is separated into an upper circuit and a lower circuit and is disposed. The AD converter has, connected thereto, a digital-to-analog converter (DAC) that generates a reference voltage (a ramp signal) required for AD conversion. In such an existing configuration, a DAC is typically provided in each of the upper circuit and the lower circuit of the AD converter to reduce the AD conversion gain variation (refer to, for example, Japanese Unexamined Patent Application Publication No. 2014-239289).

SUMMARY

One non-limiting and exemplary embodiment provides an imaging device or the like capable of reducing the AD conversion gain variation.

In one general aspect, the techniques disclosed here feature an imaging device including a pixel array having a plurality of pixels two-dimensionally arranged therein, a first converter that converts an analog signal output from a pixel of a first group among the plurality of pixels into a digital signal, a second converter disposed away from the first converter, where the second converter converts an analog signal output from a pixel of a second group among the plurality of pixels to a digital signal, a first ramp signal generation circuit disposed closer to the first converter than to the second converter, where the first ramp signal generation circuit supplies a first ramp signal to the first converter and the second converter, a first connection line having one end connected to an output terminal of the first ramp signal generation circuit, where the first connection line includes a portion extending away from an input terminal of the first converter in a path from the one end to the other end of the first connection line, and a second connection line having one end connected to the other end of the first connection line and the other end connected to the input terminal of the first converter, where the second connection line includes a portion extending closer to the input terminal of the first converter in a path from the one end to the other end of the second connection line.

There is provided an imaging device and the like capable of reducing the AD conversion gain variation.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2 is a schematic illustration of the configuration of an imaging device according to a second comparative example;

DETAILED DESCRIPTION

Figure 1:
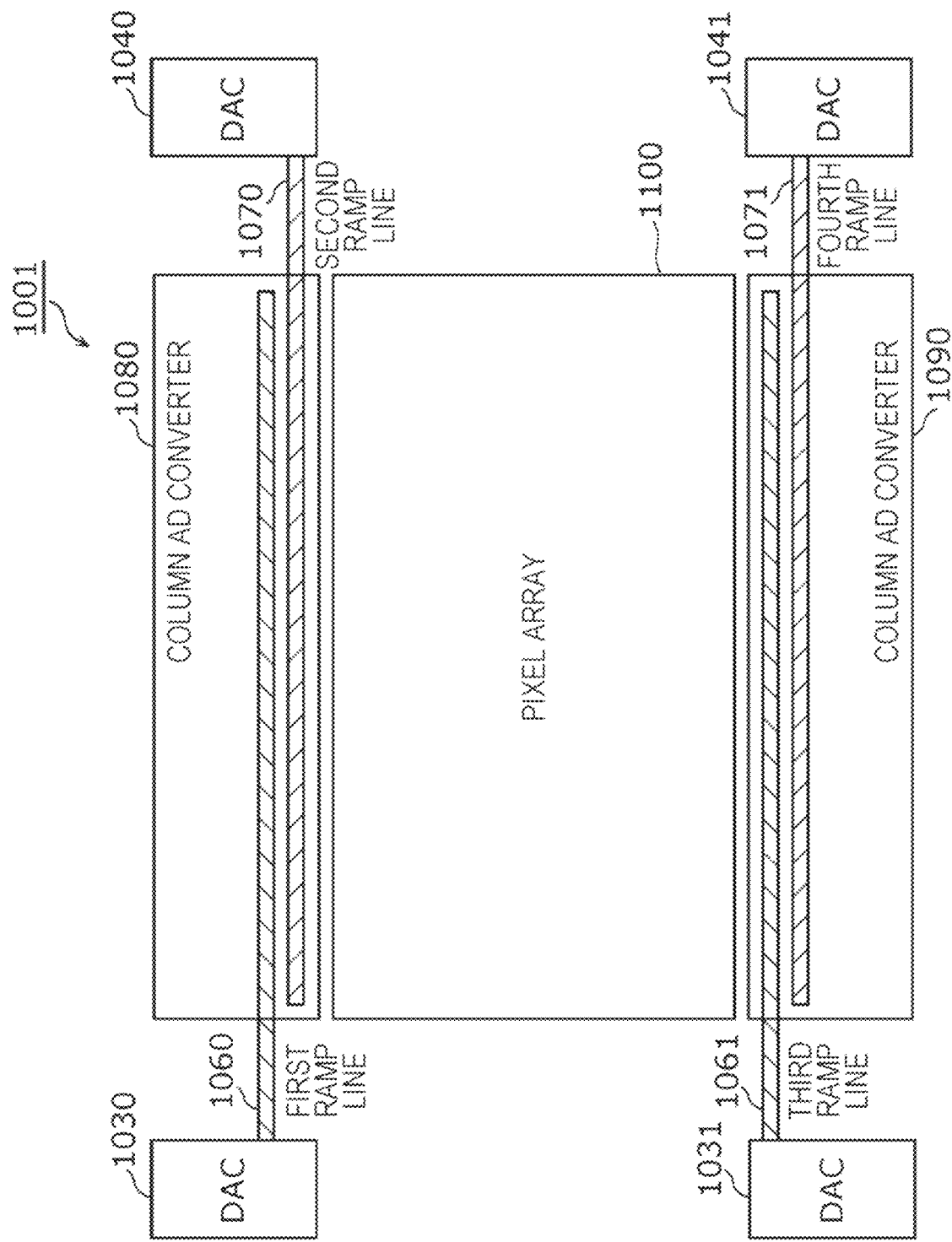
FIG. 1 is a schematic illustration of the configuration of an imaging device according to a first comparative example.

According to an aspect of the present disclosure, an imaging device includes a pixel array having a plurality of pixels two-dimensionally arranged therein, a first converter that converts an analog signal output from a pixel of a first group among the plurality of pixels into a digital signal, a second converter disposed away from the first converter, where the second converter converts an analog signal output from a pixel of a second group among the plurality of pixels to a digital signal, a first ramp signal generation circuit disposed closer to the first converter than to the second converter, where the first ramp signal generation circuit supplies a first ramp signal to the first converter and the second converter, a first connection line having one end connected to an output terminal of the first ramp signal generation circuit, where the first connection line includes a portion extending away from an input terminal of the first converter in a path from the one end to the other end of the first connection line, and a second connection line having one end connected to the other end of the first connection line and the other end connected to the input terminal of the first converter, where the second connection line includes a portion extending closer to the input terminal of the first converter in a path from the one end to the other end of the second connection line.

According to an imaging device having the above-described configuration, the difference between the length of the electrical path from the first ramp signal generation circuit to the first converter and the length of the electrical path from the first ramp signal generation circuit to the second converter can be reduced. Thus, according to an imaging device having the above-described configuration, the variation in AD conversion gain can be reduced.

In addition, the imaging device may further include a first shield located between the first connection line and the second connection line in plan view.

In addition, the imaging device may further include a third connection line having one end connected to the other end of the first connection line and the other end connected to an input terminal of the second converter.

In addition, the imaging device may further include a second shield located between the first connection line and the third connection line in plan view.

In addition, the imaging device may further include a third shield that overlaps the first connection line, the second connection line, and the third connection line in plan view.

In addition, the imaging device may further include a third connection line having one end connected to the output terminal of the first ramp signal generation circuit and the other end connected to the input terminal of the second converter.

In addition, the length of the second connection line may be equal to the length of the third connection line.

In addition, the length of the third connection line may be equal to the sum of the length of the first connection line and the length of the second connection line.

In addition, the length of the electrical path from the output terminal of the first ramp signal generation circuit to the input terminal of the first converter may be equal to the length of the electrical path from the output terminal of the first ramp signal generation circuit to the input terminal of the second converter.

In addition, the imaging device may further include a first buffer circuit connected between the first ramp signal generation circuit and the first converter and a second buffer circuit connected between the first ramp signal generation circuit and the second converter.

In addition, the imaging device may further include a second ramp signal generation circuit that supplies a second ramp signal to the first converter and the second converter. The first ramp signal and the second ramp signal may be combined and input to each of the first converter and the second converter.

In addition, the imaging device may further include a first semiconductor substrate and a second semiconductor substrate stacked on the first semiconductor substrate. The first semiconductor substrate may include the pixel array, and the second semiconductor substrate may include the first converter, the second converter, and the first ramp signal generation circuit.

In addition, the imaging device may further include a logic circuit that performs processing using a digital signal converted by the first converter and a digital signal converted by the second converter. The second semiconductor substrate may include the logic circuit, and the logic circuit may be located between the first converter and the second converter in plan view.

In addition, the pixel array may be located between the first converter and the second converter in plan view.

According to an aspect of the present disclosure, an imaging device includes a pixel array having a plurality of pixels two-dimensionally arranged therein, a first converter that converts an analog signal output from a pixel of a first group among the plurality of pixels into a digital signal, a second converter disposed away from the first converter, where the second converter converts an analog signal output from a pixel of a second group among the plurality of pixels to a digital signal, and a first ramp signal generation circuit disposed closer to the first converter than to the second converter, where the first ramp signal generation circuit supplies a first ramp signal to the first converter and the second converter. The length of the electrical path from an output terminal of the first ramp signal generation circuit to an input terminal of the first converter is equal to the length of the electrical path from the output terminal of the first ramp signal generation circuit to the input terminal of the second converter.

According to the imaging device having the above-described configuration, the difference between the length of the electrical path from the first ramp signal generation circuit to the first converter and the length of the electrical path from the first ramp signal generation circuit to the second converter can be reduced. Thus, according to an imaging device having the above-described configuration, the variation in AD conversion gain can be reduced.

According to an aspect of the present disclosure, a camera includes the imaging device and a lens that collects external light onto the pixel array.

According to the camera having the above-described configuration, the difference between the length of the electrical path from the first ramp signal generation circuit to the first converter and the length of the electrical path from the first ramp signal generation circuit to the second converter can be reduced. Therefore, according to the imaging device having the above-described configuration, the variation in AD conversion gain can be reduced. As a result, according to the camera having the above-described configuration, the variation in AD conversion gain can be reduced.

Underlying Knowledge Forming Basis of the Present Disclosure

As described above, in most imaging devices equipped with a single-slope analog-to-digital converter and, in particular, in large-screen models, a column AD converter that performs analog-to-digital conversion on the output signals of a pixel array is separated into an upper portion and a lower portion and is disposed. As a configuration example in this case, Japanese Patent No. 6442711, for example, describes a configuration in which four digital-to-analog converters (DACs) each functioning as a ramp signal generation circuit that generates a reference voltage (a ramp signal) required for AD conversion are provided in the upper, lower, left, and right sides of an image sensor.

FIG. 1 is a schematic illustration of the configuration of an imaging device 1001 according to a first comparative example.

As illustrated in FIG. 1, the imaging device 1001 according to the first comparative example includes a DAC 1030 and a DAC 1040 on the upper left and upper right sides in the column direction of a pixel array 1100, respectively, and a DAC 1031 and a DAC 1041 on the lower left and lower right sides in the column direction of the pixel array 1100, respectively. The imaging device 1001 further includes a column AD converter 1080 above the pixel array 1100. The column AD converter 1080 converts an analog signal output from the pixel array 1100 into a digital signal. The imaging device 1001 still further includes a column AD converter 1090 below the pixel array 1100. The column AD converter 1090 converts an analog signal output from the pixel array 1100 to a digital signal.

The ramp signals output from the DAC 1030 and the DAC 1040 are input to the column AD converter 1080 through a first ramp line 1060 and a second ramp line 1070, respectively, and are electrically combined. The column AD converter 1080 converts the analog signal, which is the output of the pixel array 1100, into a digital signal by using the electrically combined ramp signal. As a result, the left-right symmetry in the column AD converter 1080 is increased and, thus, the left-right error in AD conversion is reduced. The same applies to the column AD converter 1090.

However, between the column AD converter 1080 and the column AD converter 1090 arranged in the vertical direction, an error in AD conversion may occur due to individual difference between the DAC 1030 and DAC 1040 and individual difference between the DAC 1031 and DAC 1041.

FIG. 2 is a block diagram schematically illustrating the configuration of an imaging device 2001 according to a second comparative example.

As illustrated in FIG. 2, each of the two DACs 2030 and 2040 supplies a ramp signal to the column AD converter 1080 and the column AD converter 1090. As a result, it is possible to eliminate an error in AD conversion between the column AD converter 1080 and the column AD converter 1090 caused by individual difference between the DACs.

However, since the ramp signal is a time variant signal (TVS) having a slope. Therefore, if the difference between the time constant of the wiring route between the DAC 2030 and the column AD converter 1080 and the time constant of the wiring route between the DAC 2030 and the column AD converter 1090 is large, an error in AD conversion between the column AD converter 1080 and the column AD converter 1090 occurs. This problem is more prominent if the frequency band determined by the time constant of the wiring route is narrower than the frequency band of the ramp line.

Figure 3A:
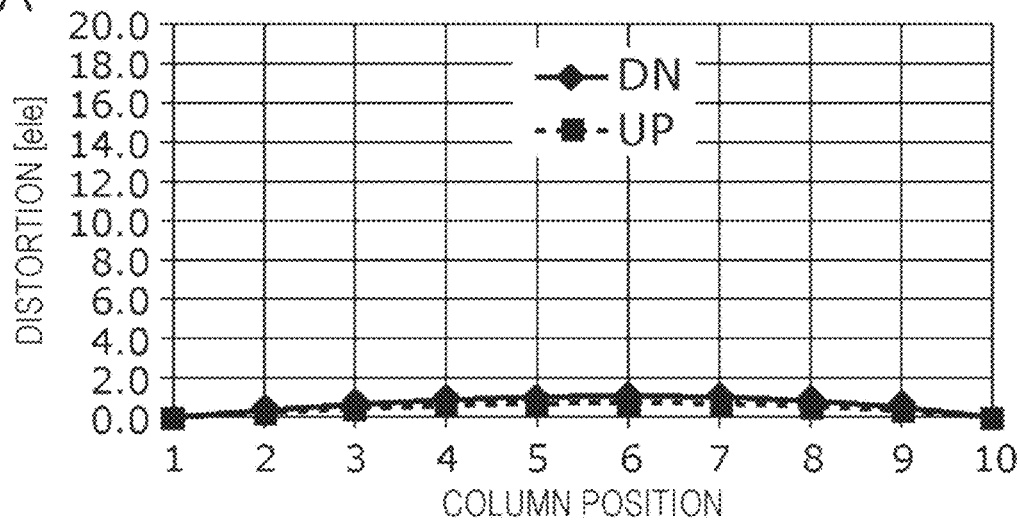
FIG. 3A is a first diagram illustrating a simulation result of an imaging device according to the second comparative example.
Figure 3B:
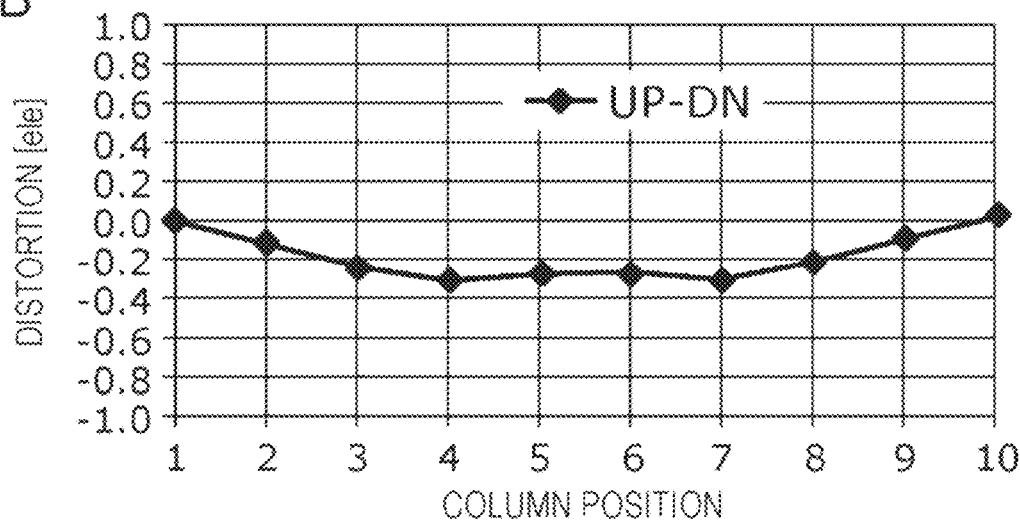
FIG. 3B is a second diagram illustrating a simulation result of the imaging device according to the second comparative example.
Figure 3C:
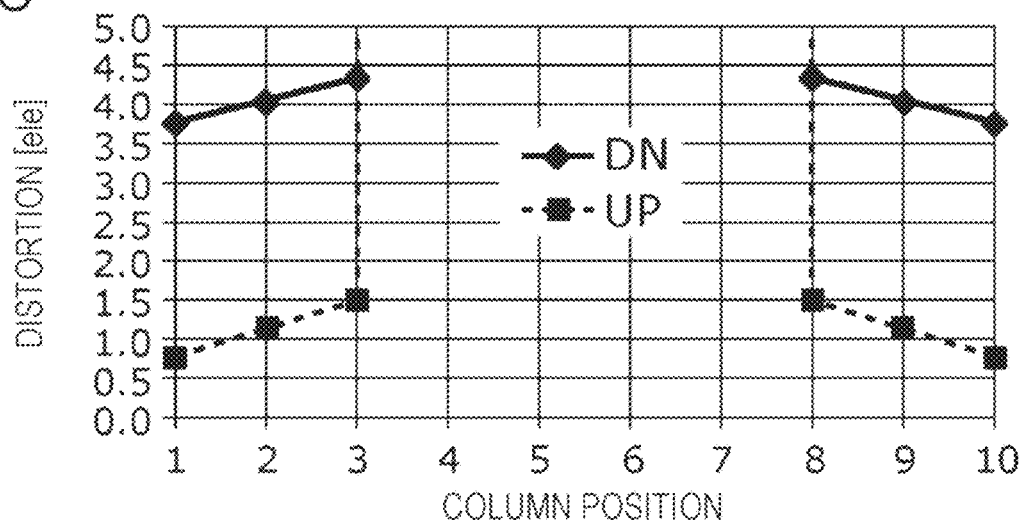
FIG. 3C is a third diagram illustrating a simulation result of the imaging device according to the second comparative example.

FIGS. 3A, 3B, and 3C illustrate the simulation results of the imaging device 2001 according to the second comparative example. In FIGS. 3A, 3B, and 3C, "DN" represents the simulation result of the lower column AD converter 1090, and "UP" represents the simulation result of the upper column AD converter 1080.

FIG. 3A illustrates the results of AD conversion during a dark time. The abscissa indicates the column position when the pixel array 1100 is divided into 10 equal sections in the horizontal direction. The ordinate represents the distortion expressed as a value obtained by converting the value after AD conversion into its equivalent number of electrons. Since a ramp signal is supplied from each of the left and right sides, the curves follow a bowl-like distortion shape that is convex upward. However, the elevation of the curve is different between UP and DN, and DN has a larger elevation than UP.

FIG. 3B is a diagram illustrating a difference in AD conversion result obtained by subtracting the AD conversion result of the lower column AD converter 1090 from the AD conversion result of the upper column AD converter 1080. As illustrated in FIG. 3B, the difference curve follows a bowl-like shape that is convex downward. This difference particularly gives a negative impact on the streaking properties.

FIG. 3C illustrates the streaking properties when bright light is incident on the central portion of the pixel array 1100 (between the column positions 3 and 8). More specifically, FIG. 3C illustrates a result after correlated double sampling (CDS) which is obtained by subtracting the dark-time AD conversion result illustrated in FIG. 3A from the AD conversion result when bright light is incident on the central portion of the pixel array 1100. As illustrated in FIG. 3C, the distortion value at the peripheral portion of the pixel array 1100 rises from 0 (ele). In particular, the DN curve has a large rise. It is a fateful flaw in an imaging device in which optical black (OB) region correction cannot be implemented due to cost reduction requirements and the like. The slope of the curve at the peripheral portion of the pixel array 1100 is generated by, for example, the kickback of a comparator, as described in Japanese Unexamined Patent Application Publication No. 2014-239289.

The influence of the kickback of the comparator is described below with reference to FIGS. 4A, 4B, and 4C.

Figure 4A:
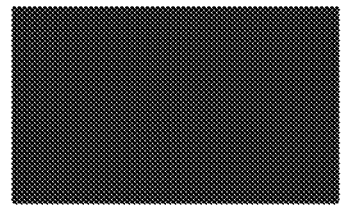
FIG. 4A is a schematic illustration of a dark-time screen.

FIG. 4A is a schematic illustration of a dark-time screen. FIG. 4B is a first schematic illustration of a screen having a bright portion (a bright central portion). FIG. 4C is a second schematic illustration of a screen having a bright portion (a bright central portion). FIG. 4D is a schematic illustration of the waveform of a ramp signal (RAMP) and the waveform of the comparator output.

For the dark-time screen illustrated in FIG. 4A, the waveform of the ramp signal is denoted by the upper plot illustrated in FIG. 4D. The pixel signal voltage is denoted by a dashed straight line. In FIG. 4D, the no-signal state is AD-converted in the "down count period" called a P-phase period, and the pixel signal is AD-converted in the "up count period" called a D-phase period. Thereafter, the difference between the results is calculated (a CDS operation). In this manner, the correct image signal is obtained. At this time, since the image in the dark-time screen illustrated in FIG. 4A is equivalent to the image of a screen at no signal time, an all black screen with all pixel values of zeros is output.

At this time, the ramp signal does not behave in an ideal manner. As can be seen from the upper plot illustrated in FIG. 4D, at around the moment when the relationship between the image signal and the ramp signal is inverted, the comparators simultaneously perform the inversion operation and, thus, the image signal is distorted under the influence of the kickback. For the dark-time image, since the comparators of all the column circuits are simultaneously inverted on the down-count side and the up-count side, the waveforms of the ramp signals including distortion have the same shape. For this reason, no difference occurs in the AD conversion results after CDS.

Figure 4B:
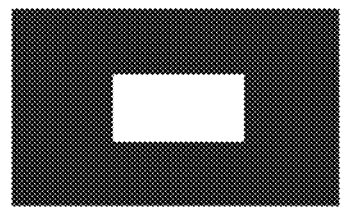
FIG. 4B is a first schematic illustration of a partially bright screen.
Figure 4C:
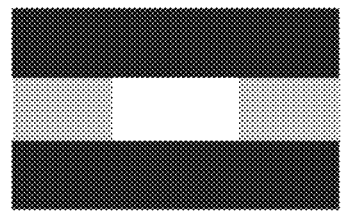
FIG. 4C is a second schematic illustration of a partially bright screen.
Figure 4D:
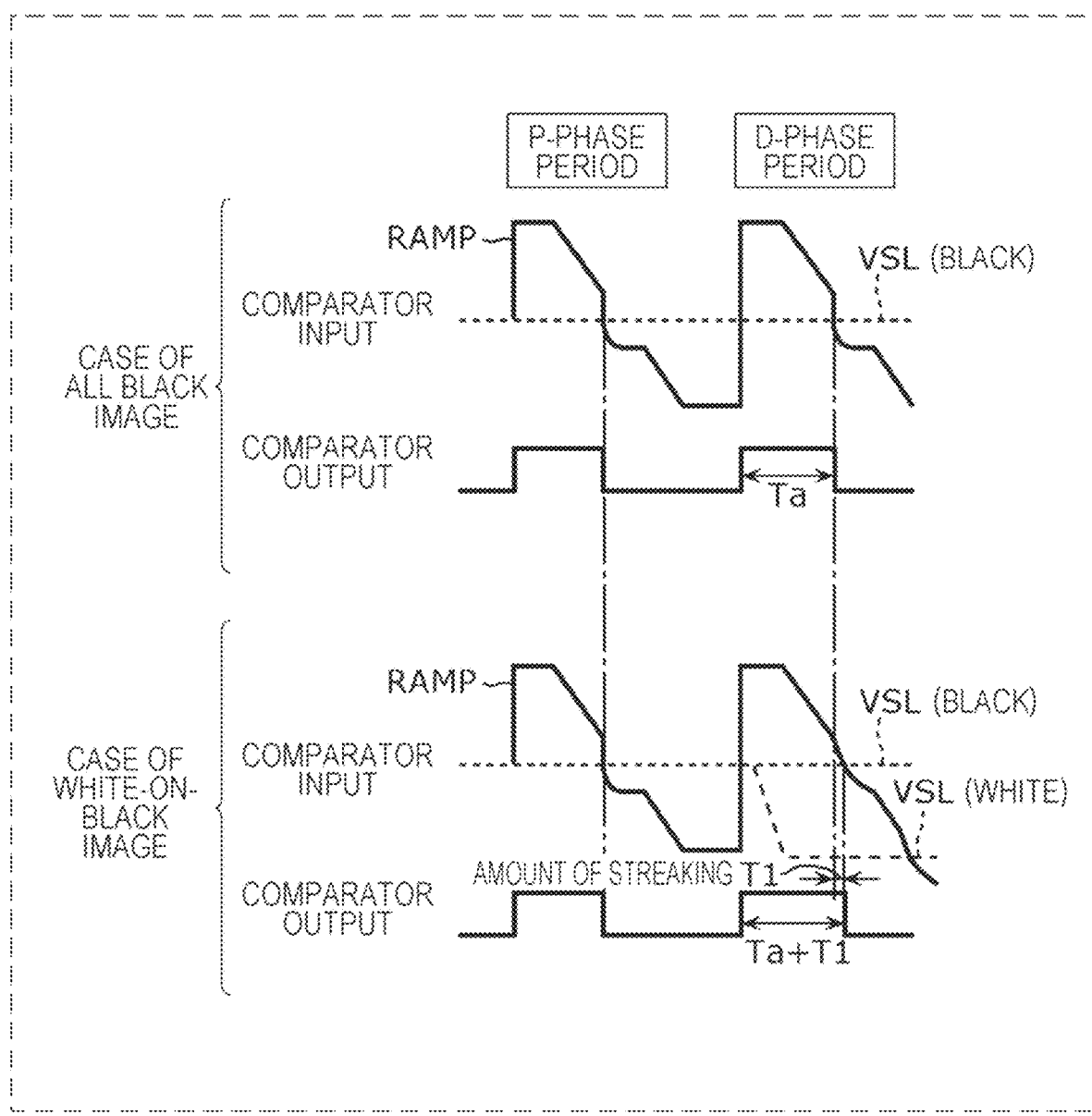
FIG. 4D is a schematic illustration of the waveform of a ramp signal and the waveform of a comparator output.

However, this is not the case for the partially bright screen illustrated in FIG. 4B. In this case, as can be seen from the lower plot illustrated in FIG. 4D, the distortion of the waveform response of the ramp signal changes on the up count side. The reason is that since part of the screen is bright and, thus, the image signal input to the column circuit drops like "VSL (white)", the number of comparators that are inverted by "VSL (black)" at the dark time decreases and, thus, the distortion decreases. As a result, the determination position of the comparator is delayed rearward and is determined to be a slightly white value. As a result, as illustrated in FIG. 4C, a screen in which the horizontal peripheries of the white portion turn whitish is generated. This is called streaking.

Although not described in Japanese Unexamined Patent Application Publication No. 2014-239289, the streaking component itself has a slope. That is, as the positon is closer to the white area, the kickback increases. As the position is farther away from the white area, the kickback decreases. The slope around the peripheral portion in FIG. 3B is generated by the kickback.

The present inventor has diligently studied and experimented with the problem of errors in AD conversion between the upper column AD converter 1080 and the lower column AD converter 1090. As a result, the present inventor found that the difference between the time constants of the wiring routes had an influence on the error. Furthermore, the present inventor found that the following two approaches are effective in solving the problem:

(1) an approach to inserting a buffer circuit at the input end of the column AD converter, and (2) an approach to making the time constants of the lamp wirings the same. Note that the first approach above is not essential. For example, if the frequency band of the electrical path for transmitting the ramp signal is equal to or wider than the frequency band of the ramp signal itself, the first approach is not always necessary. That is, the effect can be obtained by employing only the second approach.

First Embodiment

Figure 5:
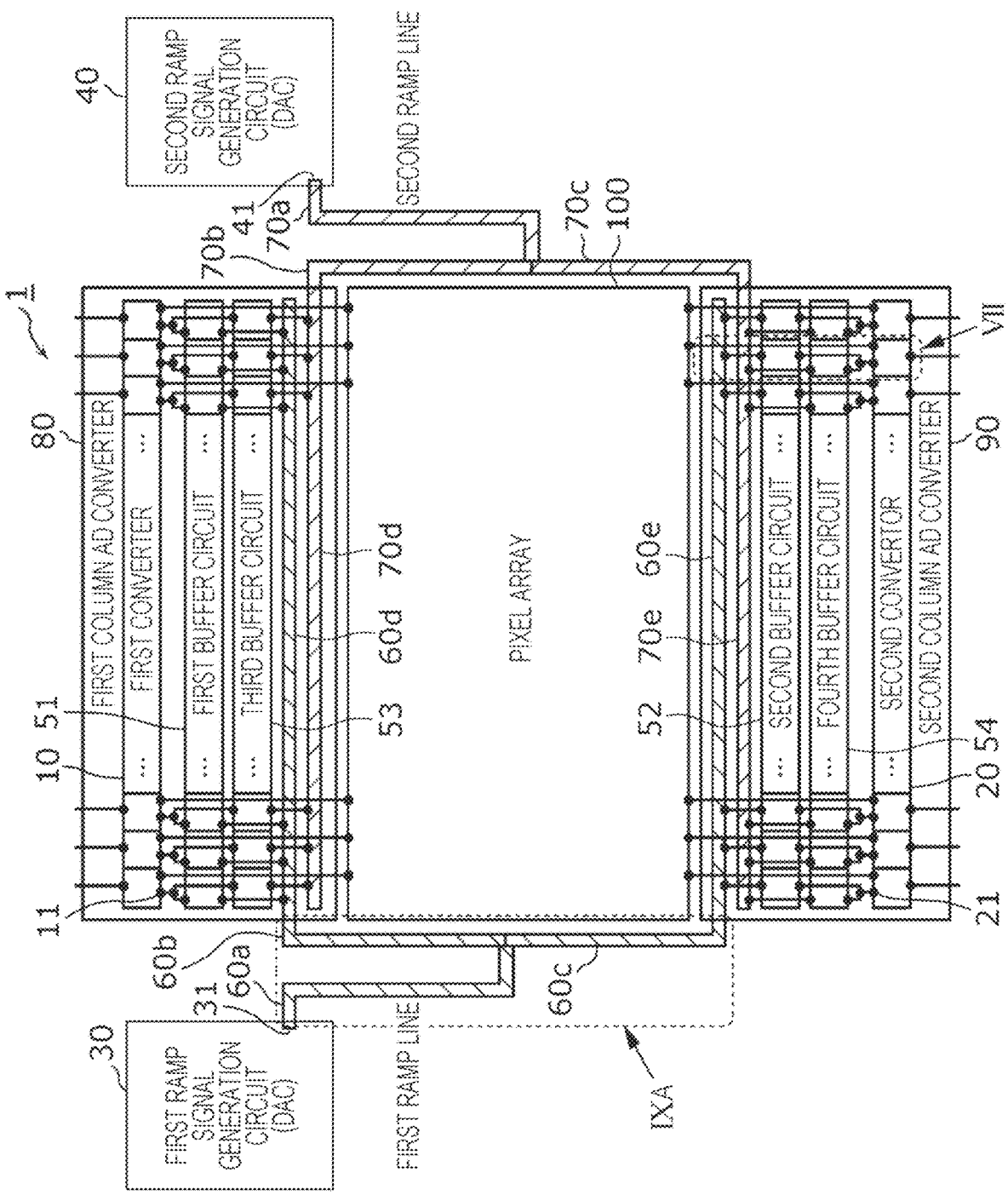
FIG. 5 is a schematic illustration of the configuration of an imaging device according to a first embodiment.

FIG. 5 is a schematic illustration of the configuration of an imaging device 1 according to the first embodiment.

As illustrated in FIG. 5, the imaging device 1 includes a pixel array 100, a first ramp signal generation circuit 30, a second ramp signal generation circuit 40, a first ramp line 60, a second ramp line 70, a first column AD converter 80, and a second column AD converter 90. The first column AD converter 80 includes a first converter 10, a first buffer circuit 51, and a third buffer circuit 53. The second column AD converter 90 includes a second converter 20, a second buffer circuit 52, and a fourth buffer circuit 54.

The pixel array 100 is configured by arranging a plurality of pixels in a matrix.

The first converter 10 converts an analog signal output from a pixel of a first group of pixels among a plurality of pixels forming the pixel array 100 into a digital signal. Hereinafter, the phrase "AD converting" is also occasionally used to mean "converting an analog signal into a digital signal". Here, the pixels of the first group may be, for example, pixels located in odd columns (or even columns) of the pixel array 100. Alternatively, the pixels of the first group may be, for example, pixels arranged in the upper half region of the pixel array 100 in the column direction. In addition, the number of signal lines for transmitting the analog signals output from the pixels of the first group may be one or plural. In this example, it is assumed that the pixels of the first group are pixels in odd columns of the pixel array 100, and the number of signals transmitting the analog signals from the pixels of the first group is plural. More specifically, the number of signal lines transmitting analog signals is the same as the number of odd columns of the pixel array 100. Each of the analog signals is also referred to as a "pixel value read from a pixel in an odd column". That is, in this example, the first converter 10 is an AD converter that converts each of the analog signals read from the odd columns of the pixel array 100 into a digital signal. In addition, in this example, the first converter 10 is a single-slope analog-to-digital converter that performs AD conversion by using a ramp signal. As illustrated in FIG. 5, in plan view, the first converter 10 is disposed above the pixel array 100 in the column direction.

The second converter 20 converts an analog signal output from a pixel of a second group of pixels among the plurality of pixels forming the pixel array 100 into a digital signal. In this example, the pixels of the second group may be, for example, pixels in even columns (or odd columns) of the pixel array 100. The pixels of the second group may be pixels arranged in the lower half region of the pixel array 100 in the column direction. Furthermore, the number of signal lines for transmitting the analog signals output from the pixels of the second group may be one or plural. In this example, it is assumed that the pixels of the second group are the pixels in the even columns of the pixel array 100, and the number of signal lines for transmitting the analog signals output from the pixels of the second group is plural. More specifically, the number of signal lines for transmitting analog signals is the same as the number of even columns of the pixel array 100. Each of the analog signals is also referred to as a "pixel value read from a pixel in an even column". That is, in this example, the second converter 20 is an AD converter that converts each of the analog signals read from even columns of the pixel array 100 into a digital signal. Furthermore, in this example, it is assumed that the number of odd columns and the number of even columns of the pixel array 100 are the same. That is, in this example, it is assumed that the number of signal lines for transmitting analog signals output from the pixels of the first group is the same as the number of signal lines transmitting analog signals output from the pixels of the second group. In addition, in this example, it is assumed that the second converter 20 is a single-slope analog-to-digital converter that performs AD conversion by using a ramp signal. As illustrated in FIG. 5, the second converter 20 is disposed below the pixel array 100 in the column direction in plan view of the pixel array 100. That is, the first converter 10 and the second converter 20 are arranged away from each other. Furthermore, the pixel array 100 is located between the first converter 10 and the second converter 20 in plan view.

The first ramp signal generation circuit 30 is connected to the first converter 10 and the second converter 20. The first ramp signal generation circuit 30 outputs the first ramp signal used by the first converter 10 and the second converter 20 for AD conversion. More specifically, the first ramp signal generation circuit 30 has an output terminal 31 for outputting the first ramp signal, and the output terminal 31 is connected to an input terminal 11 of the first converter 10 via the first ramp line 60 and a first buffer circuit (described below). In addition, the first ramp signal generation circuit 30 is connected to an input terminal 21 of the second converter 20 via the first ramp line 60 and the second buffer circuit 52 (described below). The first converter 10 may have a configuration including only one input terminal 11 or a configuration including a plurality of input terminals 11. The second converter 20 may have a configuration including only one input terminal 21 or a configuration including a plurality of input terminals 21. In this example, the first converter 10 has a plurality of input terminals 11. More specifically, the first converter 10 has the input terminals 11 equal in number to the number of odd columns of the pixel array 100.

As illustrated in plan view of FIG. 5, the first ramp signal generation circuit 30 is disposed above the pixel array 100 in the column direction and to the left of the pixel array 100 in the row direction.

The length of the electrical path connecting the output terminal 31 of the first ramp signal generation circuit 30 to the input terminal 11 of the first converter 10 may be determined to be the same as the electrical path connecting the output terminal 31 of the first ramp signal generation circuit 30 to the input terminal 21 of the second converter 20. If each of the number of input terminals 11 of the first converter 10 and the number of the input terminals 21 of the second converter 20 is plural, the length of an electrical path connecting the output terminal 31 of the first ramp signal generation circuit 30 to the input terminal 11 having the shortest electrical path from the output terminal 31 of the first ramp signal generation circuit 30 among the input terminals 11 of the first converter 10 may be determined to be the same as the length of an electrical path connecting the output terminal 31 of the first ramp signal generation circuit 30 to the input terminal 21 having the shortest electrical path from the output terminal 31 of the first ramp signal generation circuit 30 among the input terminals 21 of the second converter 20. According to the present embodiment, the first converter 10 has a plurality of input terminals 11, and the second converter 20 has a plurality of input terminals 21. In addition, the length of an electrical path connecting the output terminal 31 of the first ramp signal generation circuit 30 to the input terminal 11 having the shortest electrical path from the output terminal 31 of the first ramp signal generation circuit 30 among the input terminals 11 of the first converter 10 is the same as the length of an electrical path connecting the output terminal 31 of the first ramp signal generation circuit 30 to the input terminal 21 having the shortest electrical path from the output terminal 31 of the first ramp signal generation circuit 30 among the input terminals 21 of the second converter 20. Consequently, the time constants of the electrical paths can be made substantially the same. The phrase "the lengths of electrical paths are substantially the same" is used herein to indicate that the difference between one electrical path and the other electrical path is within ±20% of one electrical path, for example. Alternatively, the difference may be within ±10%. In the case of widely used digital still cameras, the difference needs to be within ±20%. In the case of high precision applications, such as industrial cameras, the difference needs to be within ±10%.

The second ramp signal generation circuit 40 is connected to the first converter 10 and the second converter 20. The second ramp signal generation circuit 40 outputs the second ramp signal used by the first converter 10 and the second converter 20 for AD conversion. More specifically, the second ramp signal generation circuit 40 has an output terminal 41 that outputs the first ramp signal, and the output terminal 41 is connected to the input terminal 11 of the first converter 10 via a second ramp line 70 and a third buffer circuit 53 (described below). Furthermore, the second ramp signal generation circuit 40 is connected to the input terminal 21 of the second converter 20 via a second ramp line 70 and a fourth buffer circuit 54 (described below).

As illustrated in plan view of FIG. 5, the second ramp signal generation circuit 40 is disposed above the pixel array 100 in the column direction and to the right of the pixel array in the row direction.

The length of the electrical path connecting the output terminal 41 of the second ramp signal generation circuit 40 to the input terminal 11 of the first converter 10 is equal to the length of the electrical path connecting the output terminal 41 of the second ramp signal generation circuit 40 to the input terminal 21 of the second converter 20. If each of the number of the input terminals 11 of the first converter 10 and the number of the input terminals 21 of the second converter 20 is plural, the length of an electrical path connecting the output terminal 41 of the second ramp signal generation circuit 40 to the input terminal 11 having the shortest electrical path from the output terminal 41 of the second ramp signal generation circuit 40 among the input terminals 11 of the first converter 10 is equal to the length of an electrical path connecting the output terminal 41 of the second ramp signal generation circuit 40 to the input terminal 21 having the shortest electrical path from the output terminal 41 of the second ramp signal generation circuit 40 among the input terminals 21 of the second converter 20. According to the present embodiment, the first converter 10 has a plurality of input terminals 11, and the second converter 20 has a plurality of input terminals 21. Consequently, the length of an electrical path connecting the output terminal 41 of the second ramp signal generation circuit 40 to the input terminal 11 having the shortest electrical path from the output terminal 41 of the second ramp signal generation circuit 40 among the input terminals 11 of the first converter 10 is equal to the length of an electrical path connecting the output terminal 41 of the second ramp signal generation circuit 40 to the input terminal 21 having the shortest electrical path from the output terminal 41 of the second ramp signal generation circuit 40 among the input terminals 21 of the second converter 20. The first buffer circuit 51 is connected between the first ramp signal generation circuit 30 and the first converter 10. The first buffer circuit 51 buffers the first ramp signal.

The second buffer circuit 52 is connected between the first ramp signal generation circuit 30 and the second converter 20. The second buffer circuit 52 buffers the first ramp signal.

The third buffer circuit 53 is connected between the second ramp signal generation circuit 40 and the first converter 10. The third buffer circuit 53 buffers the second ramp signal.

The fourth buffer circuit 54 is connected between the second ramp signal generation circuit 40 and the second converter 20. The fourth buffer circuit 54 buffers the second ramp signal.

The first ramp line 60 is connected to the output terminal 31 of the first ramp signal generation circuit 30. The first ramp line 60 transmits the first ramp signal output from the output terminal 31 of the first ramp signal generation circuit 30. The first ramp line 60 includes a first wiring line 60a, a second wiring line 60b, a third wiring line 60c, a fourth wiring line 60d, and a fifth wiring line 60e.

The first wiring line 60a has one end connected to the output terminal 31 of the first ramp signal generation circuit 30 and includes a portion extending away from the input terminal 11 of the first converter 10 in a path from the one end to the other end. The other end of the first wiring line 60a is connected to one end of the second wiring line 60b and one end of the third wiring line 60c. The first wiring line 60a is an example of a first connection line.

The second wiring line 60b has one end connected to the other end of the first wiring line 60a and includes a portion extending closer to the first converter 10 in a path from the one end to the other end of the second wiring line 60b. The other end of the second wiring line 60b is connected to one end of the fourth wiring line 60d. The other end of second wiring line 60b is connected to the input terminal 11 of the first converter 10 via the fourth wiring line 60d and the first buffer circuit 51. The electrical path extending from one end of the second wiring line 60b to the input terminal 11 of the first converter 10 via the fourth wiring line 60d and the first buffer circuit 51 is an example of a second connection line.

The third wiring line 60c has one end connected to the other end of the first wiring line 60a and includes a portion extending closer to the input terminal 21 of the second converter 20 in a path from the one end to the other end of the third wiring line 60c. The other end of the third wiring line 60c is connected to one end of the fifth wiring line 60e. The other end of the third wiring line 60c is connected to the first input terminal 21 of the second converter 20 via the fifth wiring line 60e and the second buffer circuit 52. An electrical path extending from one end of the third wiring line 60c to the input terminal 21 of the second converter 20 via the fifth wiring line 60e and the second buffer circuit 52 is an example of a third connection line.

The length of the electrical path extending from the one end of the second wiring line 60b to the input terminal 11 of the first converter 10 may be equal to the length of the electrical path extending from the one end of the third wiring line 60c to the input terminal 21 of the second converter 20. The phrase "the lengths of the electrical paths are equal" is used herein to indicate that the difference between the electrical paths is within ±20%, for example. Alternatively, the range of the percentage may be ±10%.

The fourth wiring line 60d is a portion of the first ramp line 60 disposed in the first column AD converter 80. One end of the fourth wiring line 60d is connected to the other end of the second wiring line 60b.

The fifth wiring line 60e is a portion of the first ramp line 60 disposed in the second column AD converter 90. One end of the fifth wiring line 60e is connected to the other end of the third wiring line 60c.

The second ramp line 70 is connected to the output terminal 41 of the second ramp signal generation circuit 40. The second ramp line 70 transmits the second ramp signal output from the output terminal 41 of the second ramp signal generation circuit 40. The second ramp line 70 includes a first wiring line 70a, a second wiring line 70b, a third wiring line 70c, a fourth wiring line 70d, and a fifth wiring line 70e.

The first wiring line 70a has one end connected to the output terminal 41 of the second ramp signal generation circuit 40 and includes a portion extending away from the input terminal 11 of the first converter 10 in a path from one end to the other end of the first wiring line 70a. The other end of the first wiring line 70a is connected to one end of the second wiring line 70b and one end of the third wiring line 70c.

The second wiring line 70b has one end connected to the other end of the first wiring line 70a and includes a portion extending closer to the first converter 10 in a path from one end to the other end of the second wiring line 70b. The other end of the second wiring line 70b is connected to one end of the fourth wiring line 70d. The other end of the second wiring line 70b is connected to the input terminal 11 of the first converter 10 via the fourth wiring line 70d and the third buffer circuit 53.

The third wiring line 70c has one end connected to the other end of the first wiring line 70a and includes a portion extending closer to the input terminal 21 of the second converter 20 in a path from the one end to the other end of the third wiring line 70c. The other end of the third wiring line 70c is connected to one end of the fifth wiring line 70e. The other end of the third wiring line 70c is connected to the input terminal 21 of the second converter 20 via the fifth wiring line 70e and the fourth buffer circuit 54.

The length of the electrical path from the one end of the second wiring line 70b to the input terminal 11 of the first converter 10 may be the same as the length of the electrical path from the one end of the third wiring line 70c to the input terminal 21 of the second converter 20. The phrase "the lengths of the electrical paths are the same" is used herein to indicate that the difference between the electrical paths is within ±10%, for example. Alternatively, the difference may be within ±5%.

The fourth wiring line 70d is a portion of the second ramp line 70 that is disposed in the first column AD converter 80. One end of the fourth wiring line 70d is connected to the other end of the second wiring line 70b.

The fifth wiring line 70e is a portion of the second ramp line 70 that is disposed in the second column AD converter 90. One end of the fifth wiring line 70e is connected to the other end of the third wiring line 70c.

As described above, the above-described two approaches are combined and applied to the imaging device 1 having the above-described configuration. The two approaches are described in detail below.

The first approach (1) to inserting a buffer circuit at the input end of the column AD converter is described first.

Figure 6:
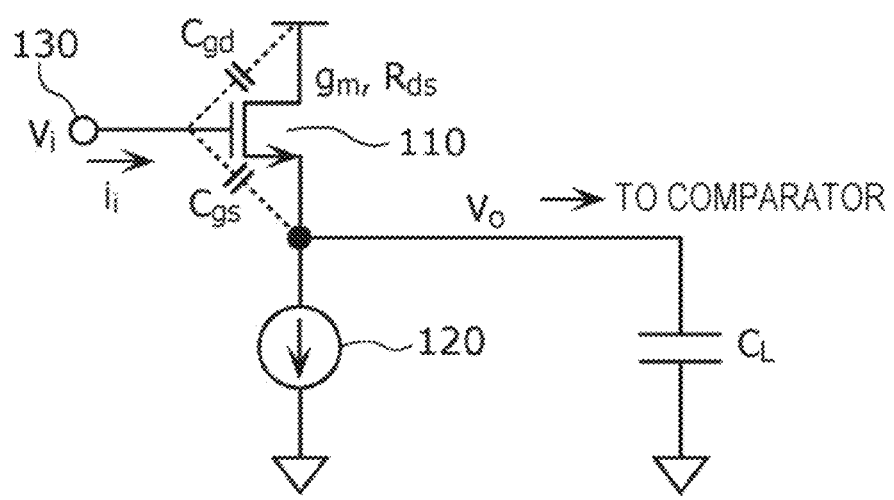
FIG. 6 is a circuit diagram illustrating a configuration example of a buffer circuit using a source follower.

FIG. 6 is a circuit diagram illustrating a configuration example of a buffer circuit using a source follower.

As illustrated in FIG. 6, the ramp line 130 (corresponding to the first ramp line 60 or the second ramp line 70 in this example) is inputted to the source follower constituted by an NMOS transistor 110 and a current source 120 before being inputted to a comparator.

Let $C_L$ be the capacitance of the input end of the comparator, let $g_m$ be the mutual conductance of the NMOS transistor 110, let $R_{ds}$ be the output resistance, let $C_{gd}$ be the parasitic capacitance between the gate and the drain, and let $G_{gs}$ be the parasitic capacitance between the gate and the source. Then, the conductance $G_i = i_i/V_i$ is expressed as follows:

$$G_i = s\left\{C_{gd} + C_{gs}\left(1 - \frac{sC_{gs} + gm}{s(C_{gs} + C_L) + gm}\right)\right\}$$

At this time, assuming that the frequency band of the source follower is sufficiently higher than those of the ramp line 130 and the comparator, the conductance $G_i$ of the source follower is expressed by the following simplified equation:

$$G_i = sC_{gd}$$

This equation suggests that the load capacity as seen from the ramp line 130 (corresponding to the first ramp line 60 or the second ramp line 70 here) is drastically reduced from $C_L$ to $C_{gd}$.

Note that a comparator has the characteristic that it responds to an output variation so as not to transfer the output variation to the input. This means that the kickback of the comparator does not propagate to the ramp line 130 and, thus, the distortion of the ramp signal (RAMP) illustrated in FIG. 4C is greatly reduced.

Figure 7:
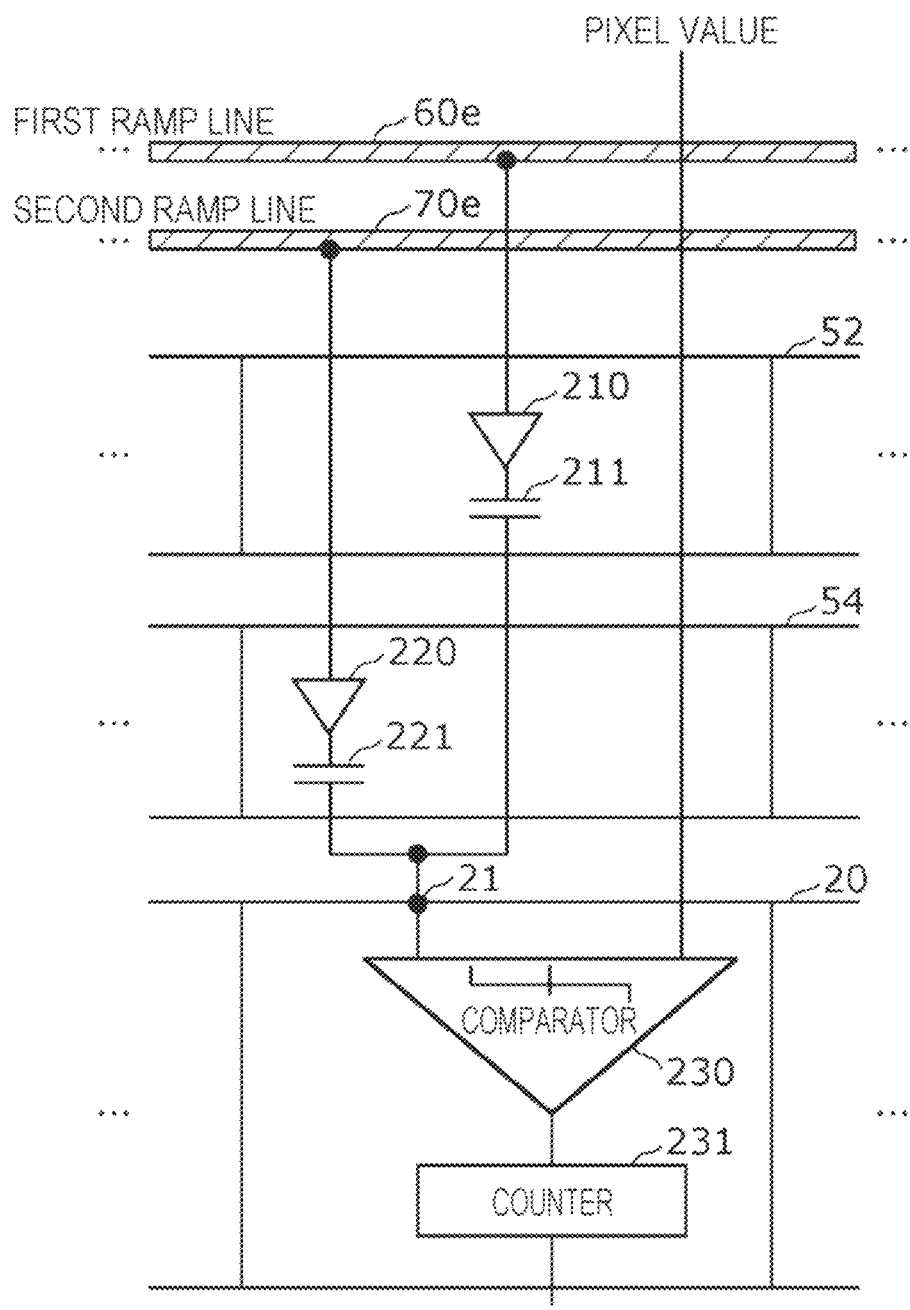
FIG. 7 is a schematic illustration of a second column AD converter having a buffer circuit inserted thereinto according to the first embodiment.

FIG. 7 is a schematic illustration of the second column AD converter 90 having a buffer circuit inserted therein. In addition, FIG. 7 is a schematic illustration of the configuration of a region VII of the second column AD converter 90 denoted by a dashed line in FIG. 5. That is, FIG. 7 is a schematic illustration of the circuit configuration of a portion of the second column AD converter 90 corresponding to one signal line for transmitting an analog signal input to the second column AD converter 90. For this reason, in the actual second column AD converter 90, the circuit configurations illustrated in FIG. 7 equal in number to the number of signal lines for transmitting analog signals are arranged side by side in the row direction of the pixel array 100. In addition, a buffer circuit is inserted in the first column AD converter 80. The buffer circuit of the second column AD converter 90 and the buffer circuit of the first column AD converter 80 may have the same configuration. The buffer circuit of the second column AD converter 90 is described below, and description of the buffer circuit of the first column AD converter 80 is not provided.

As illustrated in FIG. 7, the second buffer circuit 52 includes a buffer circuit 210 typically illustrated in FIG. 6 and a capacitor 211 having one end connected to the buffer circuit 210. The fourth buffer circuit 54 includes a buffer circuit 220 typically illustrated in FIG. 6 and a capacitor 221 having one end connected to the buffer circuit 220. The second converter 20 includes a comparator 230 that compares the voltage of a connection node that connects the other end of the capacitor 211 to the other end of the capacitor 221 with the voltage of the analog signal output from the pixels of the second group. The second converter 20 further includes a counter 231 to which the output of the comparator 230 is connected. The above configuration allows the first ramp signal and the second ramp signal to be combined and input to the second converter. Therefore, the comparator 230 compares the voltage of the signal obtained by combining the first ramp signal and the second ramp signal with the voltage of the analog signal. That is, the second converter 20 converts the analog signals output from the pixels of the second group into a digital signal by using, as a reference voltage, the voltage of the signal obtained by combining the first ramp signal and the second ramp signal.

The second approach (2) to making the time constants of the lamp wiring lines the same is described below.

As illustrated in FIG. 5, the first ramp line 60 connected to the output terminal 31 of the first ramp signal generation circuit 30 extends to a point near the center of the pixel array 100 in the column direction by the first wiring line 60a first. Thereafter, the first ramp line 60 branches into the second wiring line 60b and the third wiring line 60c having the same length, which are inputted to the first column AD converter 80 and the second column AD converter 90, respectively. By employing the above-described configuration for the first ramp line 60, the length of an electrical path connecting the output terminal 31 of the first ramp signal generation circuit 30 to the input terminal 11 of the first converter 10 is equal to the length of the electrical path connecting the output terminal 31 of the first ramp signal generation circuit 30 to the input terminal 21 of the second converter 20. In this manner, the time constant of the electrical path connecting the output terminal 31 of the first ramp signal generation circuit 30 to the input terminal 11 of the first converter 10 is substantially the same as the time constant of the electrical path connecting the output terminal 31 of the first ramp signal generation circuit 30 to the input terminal 21 of the second converter 20.

Similarly, the second ramp line 70 connected to the output terminal 41 of the second ramp signal generation circuit 40 extends to a point near the center of the pixel array 100 in the column direction by the first wiring line 70a first. Thereafter, the second ramp line 70 branches into the second wiring line 70b and the third wiring line 70c having the same length, which are connected to the first column AD converter 80 and the second column AD converter 90, respectively. By employing the above-described configuration for the second ramp line 70, the length of an electrical path connecting the output terminal 41 of the second ramp signal generation circuit 40 to the input terminal 11 of the first converter 10 is equal to the length of the electrical path connecting the output terminal 41 of the second ramp signal generation circuit 40 to the input terminal 21 of the second converter 20. In this manner, the time constant of the electrical path connecting the output terminal 41 of the second ramp signal generation circuit 40 to the input terminal 11 of the first converter 10 is substantially the same as the time constant of the electrical path connecting the output terminal 41 of the second ramp signal generation circuit 40 to the input terminal 21 of the second converter 20.

Figure 8A:
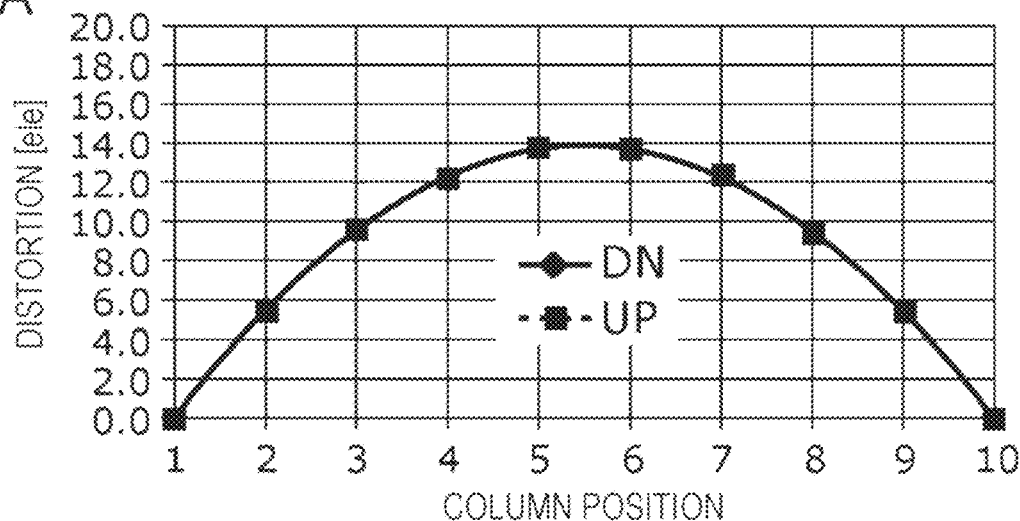
FIG. 8A is a first diagram illustrating a simulation result of the imaging device according to the first embodiment.
Figure 8B:
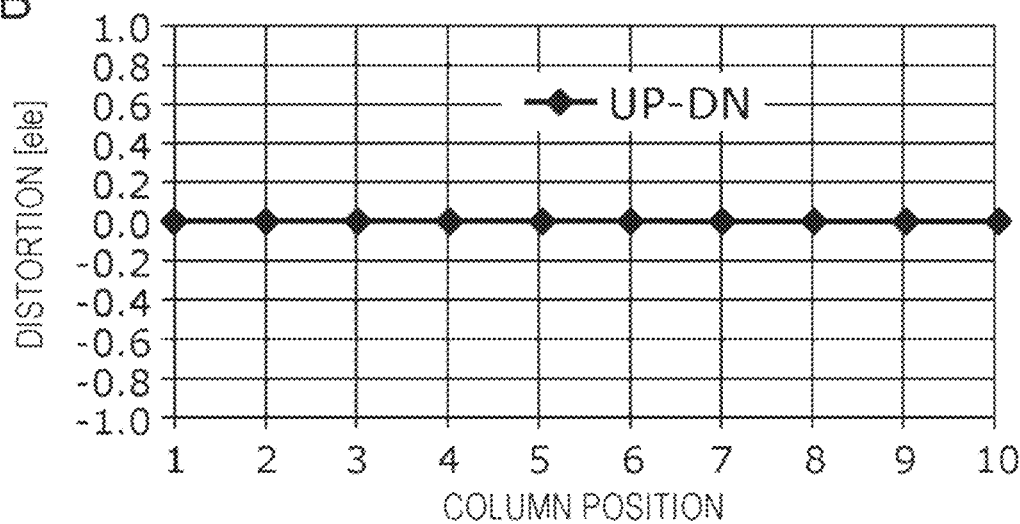
FIG. 8B is a second diagram illustrating a simulation result of the imaging device according to the first embodiment.
Figure 8C:
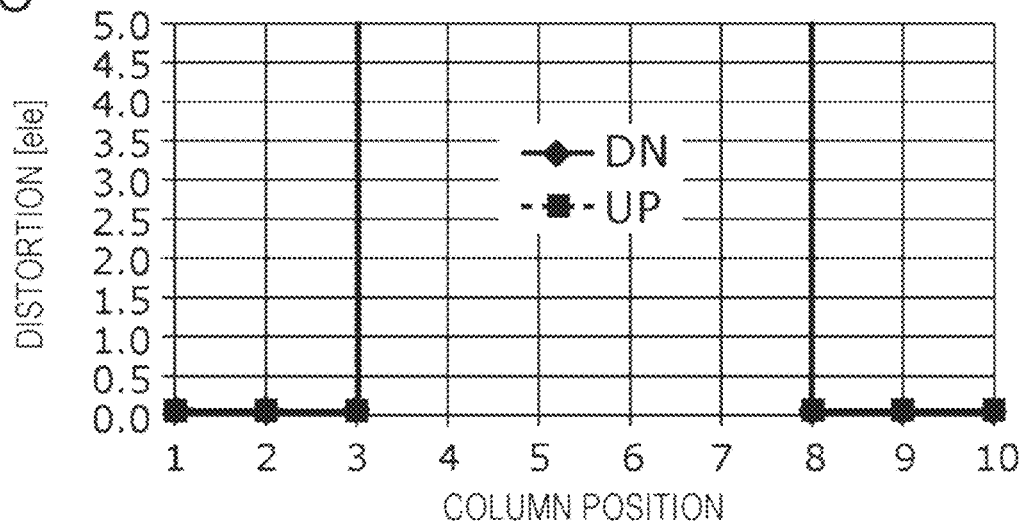
FIG. 8C is a third diagram illustrating a simulation result of the imaging device according to the first embodiment.

FIGS. 8A, 8B, and 8C illustrate the simulation results of the imaging device 1 in which the above-described two approaches are combined and applied. In FIGS. 8A, 8B, and 8C, DN denotes the simulation result of the lower column AD converter, that is, the second column AD converter 90, and UP denotes the simulation result of the upper column AD converter, that is, the first column AD converter 80.

FIG. 8A illustrates the results of AD conversion during a dark time. The abscissa represents the column position of the pixel array 100, and the ordinate represents the value after AD conversion.

FIG. 8B illustrates the difference obtained by subtracting the AD-converted value output from the lower second column AD converter 90 from the AD-converted value output from the upper first column AD converter 80, that is, the difference between the AD-converted values output from the upper and lower column AD converters. As can be seen from FIG. 8B, according to the imaging device 1, by making the time constants of the electrical paths of the upper and lower AD converters the same, the difference between the AD-converted values can be almost eliminated. In contrast, according to the imaging device 2001 of the second comparative example, as can be seen from FIG. 3B, the difference between the AD-converted values arises.

FIG. 8C illustrates the streaking characteristics when bright light is incident on the central portion of the pixel array 100. More specifically, FIG. 8C illustrates the result after CDS, which is obtained by subtracting the dark-time AD conversion result illustrated in FIG. 8A from the AD conversion result when bright light is incident on the central portion of the pixel array 1100. As suggested by FIG. 8C, according to the imaging device 1, there is no difference in the uplift in the peripheral portion of the pixel array 100 between the upper side and the lower side, and a uniform AD conversion result is obtained. Furthermore, due to the kickback reduction effect of inserting the buffer circuit, not only the streaking uplift amount itself is greatly reduced, but also the slope of streaking itself is almost eliminated. Thus, excellent characteristics that require no correction is obtained. In contrast, according to the imaging device 2001 of the second comparative example, as can be seen from FIG. 3C, uplift in the peripheral portion of the pixel array 1100 occurs. In particular, uplift in the lower column AD converter is large, and the difference between the uplifts in the upper column AD converter and the lower column AD converter arises.

The layout structure of the first ramp line 60 and the second ramp line 70 are described below with reference to FIG. 9A. The layout structure of the first ramp line 60 and the layout structure of the second ramp line 70 are the same. Therefore, the layout structure of only the first ramp lines 60 is described below, and description of the layout structure of the second ramp lines 70 is not provided.

While the form in which the first ramp line 60 is the uppermost metal wiring line is described below, the first ramp line 60 need not be the uppermost metal wiring line.

Figure 9A:
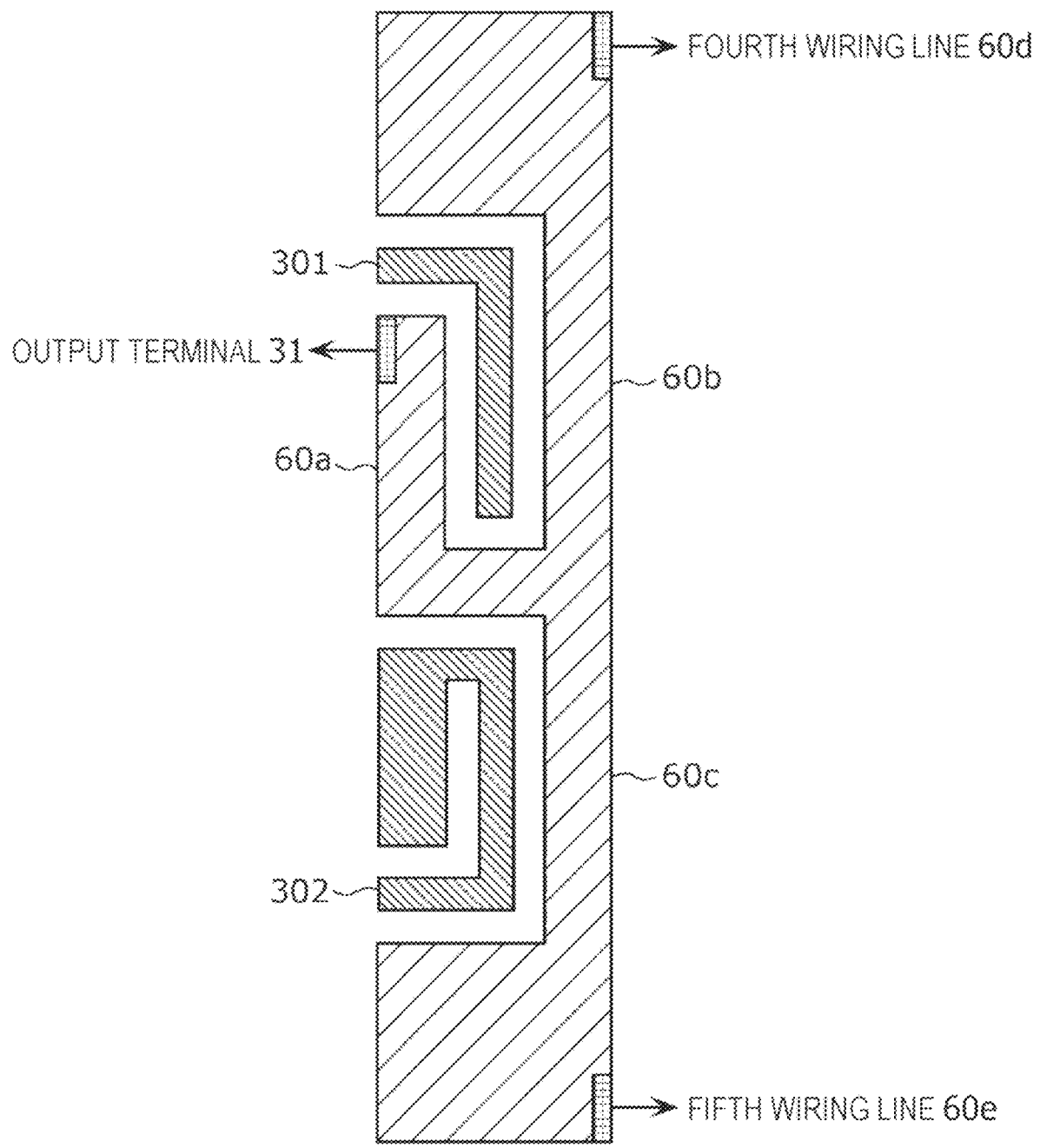
FIG. 9A is a first schematic illustration of the layout structure of a first ramp line according to the first embodiment.
Figure 9B:
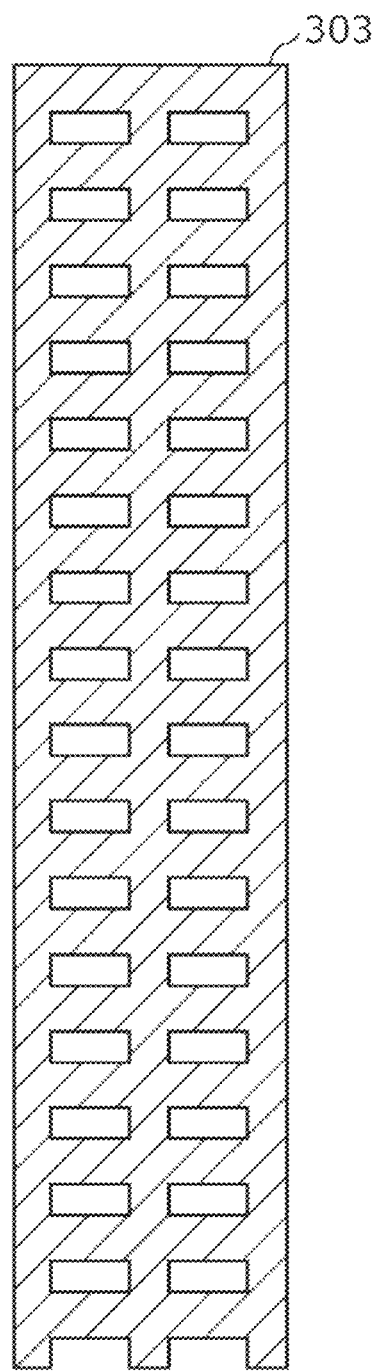
FIG. 9B is a second schematic illustration of the layout structure of the first ramp line according to the first embodiment.
Figure 9C:
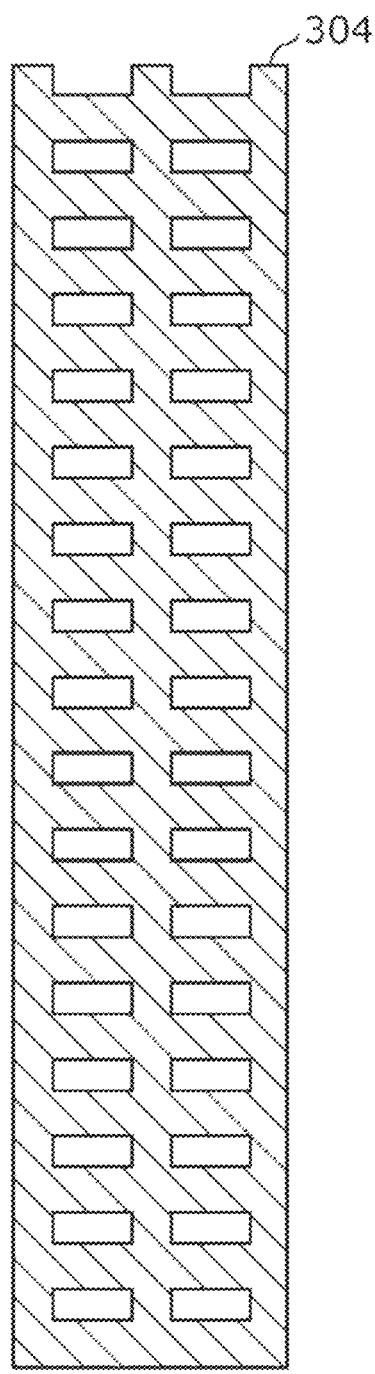
FIG. 9C is a third schematic illustration of the layout structure of the first ramp line according to the first embodiment.

FIG. 9A illustrates the layout structure of the wiring layer including the first ramp line 60 in a region IXA denoted by a dashed line in FIG. 5. That is, FIG. 9A is a schematic illustration of the layout structure of a wiring layer including the first wiring line 60a, the second wiring line 60b, and the third wiring line 60c. FIG. 9B is a schematic illustration of the layout structure of the wiring layer one layer below the wiring layer including the first ramp line 60. FIG. 9C is a schematic illustration of the layout structure of the wiring layer two layers below the wiring layer including the first ramp line 60.

As illustrated in FIG. 9A, the imaging device 1 includes a first shield 301 located between the first wiring line 60a and the second wiring line 60b and a second shield 302 located between the first wiring line 60a and the third wiring line 60c. The first shield 301 and the second shield 302 are included in the same wiring layer as the first ramp line 60. The first shield 301 and the second shield 302 are made of metal, for example. Each of the first shield 301 and the second shield 302 may be connected to a fixed potential, for example, the ground potential.

The imaging device 1 includes the first shield 301 and the second shield 302 to separate the capacitive coupling between the first wiring line 60a and the second wiring line 60b and to separate the capacitive coupling between the first wiring line 60a and the third wiring line 60c. This configuration reduces the asymmetry between the capacitive coupling between the first wiring line 60a and the second wiring line 60b and the capacitive coupling between the first wiring line 60a and the third wiring line 60c.

The imaging device 1 includes a third shield 303 in the wiring layer that is one layer below the wiring layer of the first ramp line 60. The third shield 303 is disposed so as to overlap the first wiring line 60a, the second wiring line 60b, and the third wiring line 60c in plan view. The third shield may have a slit in part thereof. The third shield may be made of, for example, metal.

The imaging device 1 may include a fourth shield 304 in a wiring layer two layers below the wiring layer of the first ramp line 60. The fourth shield 304 may overlap the first wiring line 60a, the second wiring line 60b, and the third wiring line 60c in plan view. The fourth shield may have a slit in part thereof. The fourth shield may be made of, for example, metal. The slit of the fourth shield 304 may be provided at a position that does not overlap the slit of the third shield 303 in plan view.

The imaging device 1 includes the third shield 303 and the fourth shield 304. This configuration separates the capacitive coupling between the second wiring line 60b and an object existing below the wiring layer two layers below the wiring layer of the first ramp line. Furthermore, this configuration separates the capacitive coupling between the third wiring line 60c and an object existing below the wiring layer two layers below the wiring layer of the first ramp line. That is, this configuration reduces the asymmetry between the following two capacitive couplings:

the capacitive coupling between the second wiring line 60b and an object existing below the wiring layer two layers below the wiring layer of the first ramp line, and the capacitive coupling between the third wiring line 60c and an object existing below the wiring layer two layers below the wiring layer of the first ramp line.

As described above, the imaging device 1 includes the first shield 301 and the second shield 302 in the same wiring layer as the first ramp line 60. Furthermore, the imaging device 1 includes the third shield 303 in the wiring layer one layer below the wiring layer of the first ramp line 60 and the fourth shield 304 in the wiring layer two layers below the wiring layer of the first ramp line 60. This configuration makes the time constants of the second wiring line 60b and the third wiring line 60c substantially the same.

According to the present embodiment, the imaging device 1 to which a combination of the above-mentioned two approaches is applied has been described. However, if the frequency band of the electrical path for transmitting the ramp signal is equal to or wider than the frequency band of the ramp signal itself, the first approach (approach (1)) to inserting a buffer circuit at the input end of the column AD converter is not essential. In some cases, only the second approach (approach (2)) to making the time constants of the lamp wiring lines the same can accomplish the purpose.

Figure 12:
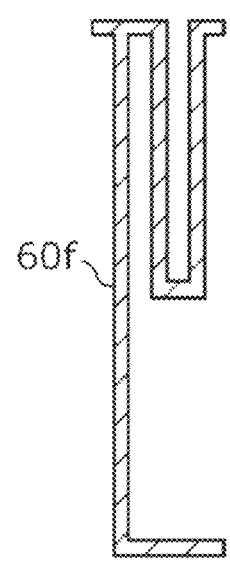
FIG. 12 is a schematic illustration of another form of the first ramp line.

In addition, according to the present embodiment, the configuration in which the shape of the first ramp line 60 is the shape illustrated in the region IXA of FIG. 5 has been described. However, the configuration is not limited thereto. For example, as illustrated in FIG. 12, the first ramp line 60 may include a sixth wiring line 60f instead of including the third wiring line 60c. Even in this case, the length of the electrical path from the output terminal 31 of the first ramp signal generation circuit 30 to the input terminal 11 of the first converter 10 may be the same as the length of the electrical path from the output terminal 31 of the first ramp signal generation circuit 30 to the input terminal 21 of the second converter 20. In this configuration, the electrical path from the output terminal 31 of the first ramp signal generation circuit 30 to the input terminal 11 of the first converter 10 via the sixth wiring line 60f, the fourth wiring line 60d and the first buffer circuit 51 is an example of a third connection line.

Second Embodiment

Figure 10A:
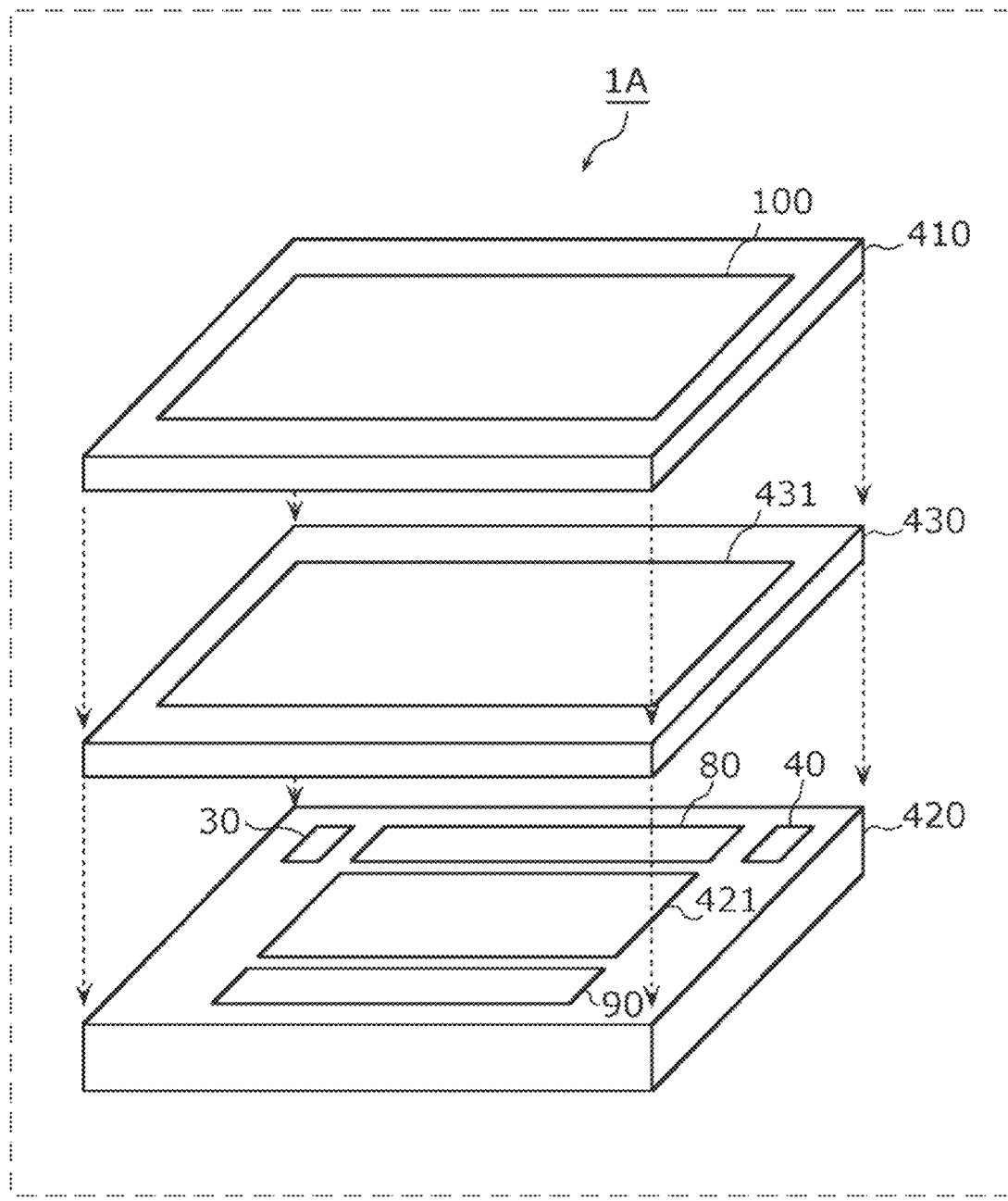
FIG. 10A is an exploded perspective view of an imaging device according to a second embodiment.

FIG. 10A is an exploded perspective view of an imaging device 1A according to the second embodiment. The same reference numerals are used in FIG. 10A for constituent elements that are the same as those used in the imaging device 1 according to the first embodiment, and detailed description of the elements are not repeated. The differences from the imaging device 1 are mainly described below.

As illustrated in FIG. 10A, the imaging device 1A includes a first semiconductor substrate 410, a second semiconductor substrate 420, and a third semiconductor substrate 430 located between the first semiconductor substrate 410 and the second semiconductor substrate 420.

Figure 10B:
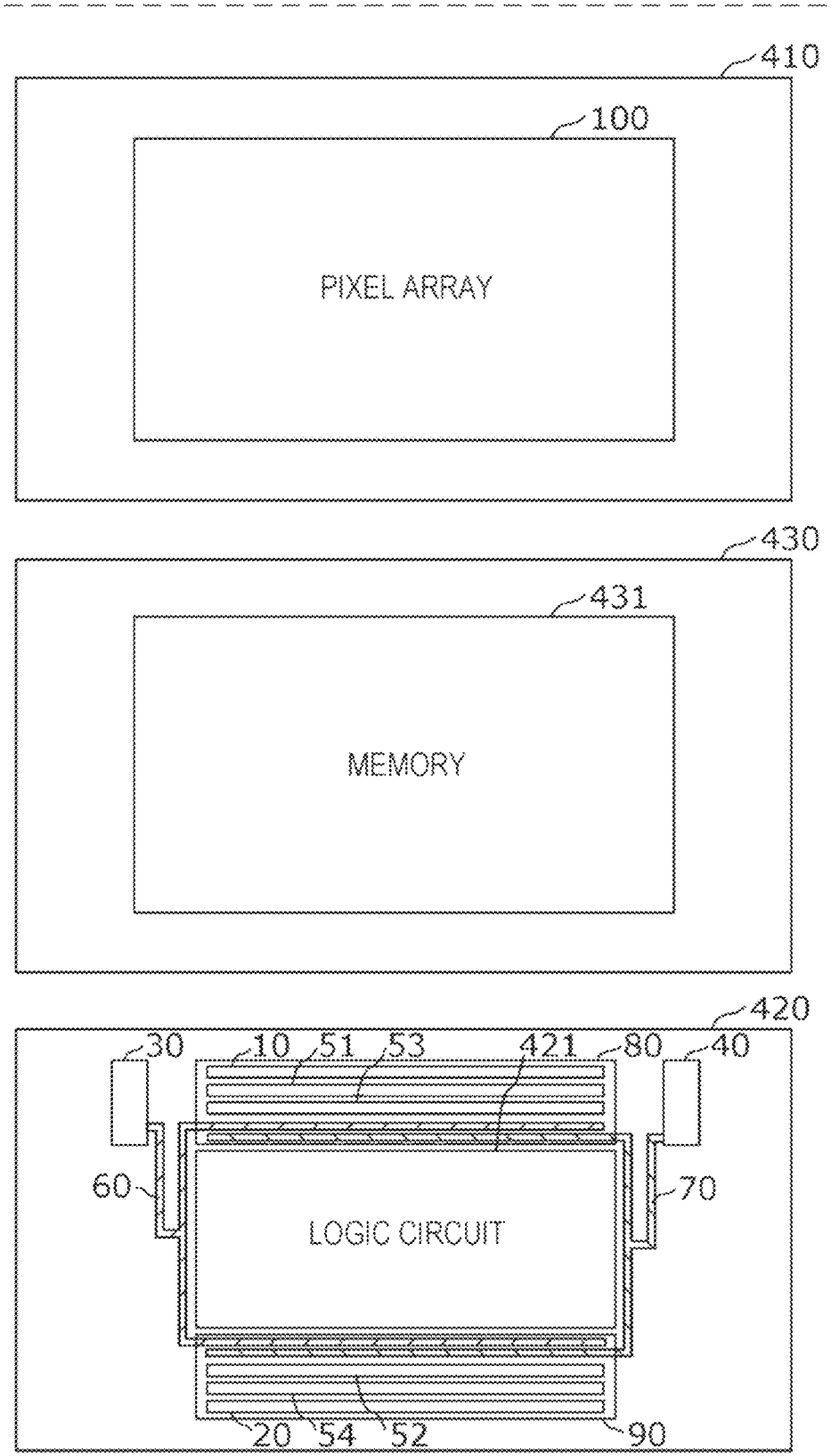
FIG. 10B is a plan view of a first semiconductor substrate, a second semiconductor substrate, and a third semiconductor substrate according to the second embodiment.

FIG. 10B is a plan view of each of the first semiconductor substrate 410, the second semiconductor substrate 420, and the third semiconductor substrate 430.

As illustrated in FIGS. 10A and 10B, the first semiconductor substrate 410 has the pixel array 100 formed thereon. The second semiconductor substrate 420 has, formed thereon, the first converter 10, the second converter 20, the first ramp signal generation circuit 30, the second ramp signal generation circuit 40, the first buffer circuit 51, the second buffer circuit 52, the third buffer circuit 53, the fourth buffer circuit 54, the first ramp line 60, the second ramp line 70, and a logic circuit 421. The third semiconductor substrate 430 has a memory 431 formed therein. That is, the first semiconductor substrate 410 includes the pixel array 100. The second semiconductor substrate 420 includes the first converter 10, the second converter 20, the first ramp signal generation circuit 30, the second ramp signal generation circuit 40, the first buffer circuit 51, the second buffer circuit 52, and the third buffer circuit 53, the fourth buffer circuit 54, the first ramp line 60, the second ramp line 70, and the logic circuit 421. The third semiconductor substrate 430 includes the memory 431. Note that the logic circuit 421 may be located between the first converter 10 and the second converter 20 in plan view.

The logic circuit 421 performs processing using the digital signal converted by the first converter 10 and the digital signal converted by the second converter 20. The processing performed by the logic circuit 421 may include, for example, image processing for correcting a captured image, processing for reducing noise, and processing for extracting specific information from the captured image.

The memory 431 is, for example, a frame memory that stores the digital signal converted by the first converter 10 and the digital signal converted by the second converter 20. The third semiconductor substrate 430 may include, for example, a logic circuit that performs artificial Intelligence (AI) processing using Convolutional Neural Network (CNN) instead of or in addition to the memory 431.

The imaging device 1A having the above-described configuration can perform large-scale processing in the logic circuit 421. For this reason, the imaging device 1A can output a high-quality image.

Third Embodiment

The imaging device 1 according to the first embodiment and the imaging device 1A according to the second embodiment can be applied as an imaging device (an image input device) in a camera, such as a digital video camera or a digital still camera.

A camera according to the third embodiment is described below in which the imaging device 1 according to the first embodiment is applied as an image capture device.

Figure 11:
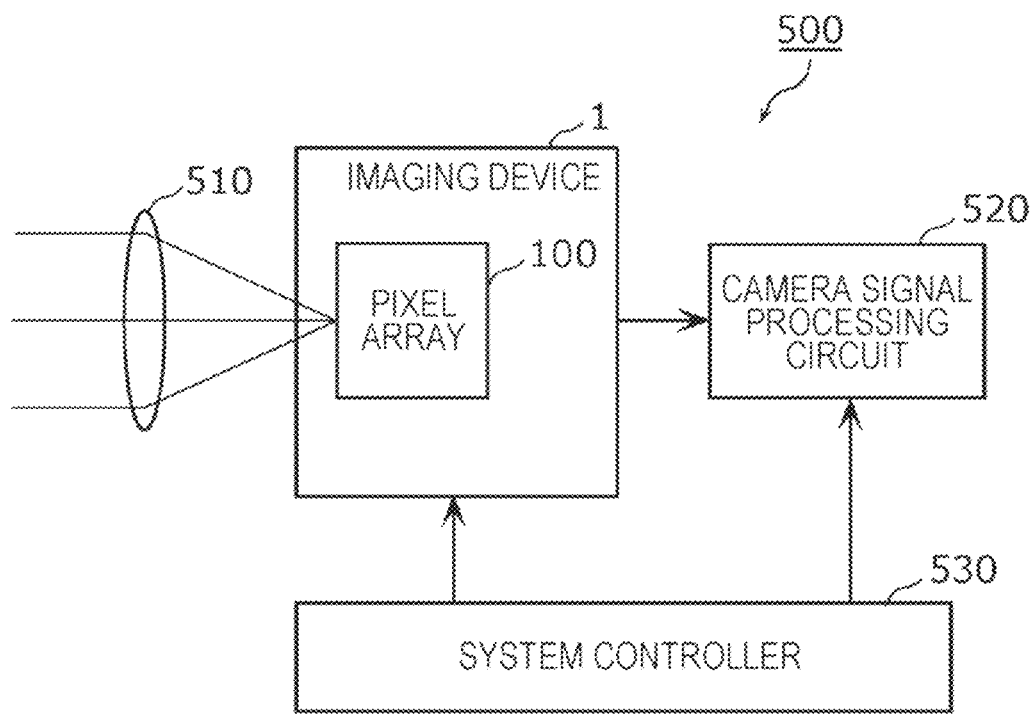
FIG. 11 is a schematic illustration of the configuration of a camera according to a third embodiment.

FIG. 11 is a block diagram of the configuration of a camera 500 according to the third embodiment. The same reference numerals are used in FIG. 11 for constituent elements that are the same as those used in the imaging device 1 according to the first embodiment, and description of the constituent elements are not repeated.

As illustrated in FIG. 11, the camera 500 includes the imaging device 1, a lens 510, a camera signal processing circuit 520, and a system controller 530.

The lens 510 collects light from the outside onto the pixel array 100 of the imaging device 1.

The camera signal processing circuit 520 performs signal processing on a signal output from the imaging device 1 and outputs an image or data to the outside.

The system controller 530 controls the imaging device 1 and the camera signal processing circuit 520.

According to the camera 500 having the above-described configuration, by applying the imaging device 1 as an image capture device, variations in AD conversion gain in the image capture device are reduced and, thus, a camera having excellent image characteristics can be achieved.

Supplement

As described above, the first to third embodiments have been described as examples of the technique disclosed in the present application. However, the technique according to the present disclosure is not limited thereto and may be applied to the embodiments with various modifications, replacements, additions, and deletions without departing from the scope and spirit of the present disclosure.

The imaging device according to the present disclosure can be widely applied to medical cameras, surveillance cameras, vehicle-mounted cameras, range-finding cameras, and the like.

What is claimed is:

1. An imaging device comprising:
a pixel array having a plurality of pixels two-dimensionally arranged;
a first converter that converts an analog signal output from a pixel of a first group among the plurality of pixels into a digital signal;
a second converter located away from the first converter, the second converter converting an analog signal output from a pixel of a second group among the plurality of pixels to a digital signal;
a first ramp signal generation circuit located closer to the first converter than to the second converter, the first ramp signal generation circuit supplying a first ramp signal to the first converter and the second converter;
a first connection line having a first end and a second end, the first end being connected to an output terminal of the first ramp signal generation circuit, the first connection line including a portion extending away from an input terminal of the first converter in a path from the first end to the second end; and
a second connection line having a third end and a fourth end, the third end being connected to the second end of the first connection line and the fourth end being connected to the input terminal of the first converter, the second connection line including a portion extending closer to the input terminal of the first converter in a path from the third end to the fourth end of the second connection line,
wherein the only electrical connection between the first ramp generation circuit and the first converter is through the first connection line and the second connection line.

2. The imaging device according to claim 1, further comprising:
a first shield located between the first connection line and the second connection line in plan view.

3. The imaging device according to claim 1, further comprising:
a third connection line having a fifth end connected to the second end of the first connection line and a sixth end connected to an input terminal of the second converter.

4. The imaging device according to claim 3, further comprising:
a second shield located between the first connection line and the third connection line in plan view.

5. The imaging device according to claim 3, further comprising:
a third shield that overlaps the first connection line, the second connection line, and the third connection line in plan view.

6. The imaging device according to claim 3, wherein a length of the second connection line is equal to a length of the third connection line.

7. The imaging device according to claim 1, further comprising:
a third connection line having a fifth end connected to the output terminal of the first ramp signal generation circuit and a sixth end connected to the input terminal of the second converter.

8. The imaging device according to claim 7, wherein a length of the third connection line is equal to the sum of a length of the first connection line and a length of the second connection line.

9. The imaging device according to claim 1, wherein a length of an electrical path from the output terminal of the first ramp signal generation circuit to the input terminal of the first converter is equal to a length of an electrical path from the output terminal of the first ramp signal generation circuit to the input terminal of the second converter.

10. The imaging device according to claim 1, further comprising:
a first buffer circuit connected between the first ramp signal generation circuit and the first converter; and
a second buffer circuit connected between the first ramp signal generation circuit and the second converter.

11. The imaging device according to claim 1, further comprising:
a second ramp signal generation circuit that supplies a second ramp signal to the first converter and the second converter,
wherein the first ramp signal and the second ramp signal are combined and input to each of the first converter and the second converter.

12. The imaging device according to claim 1, further comprising:
a first semiconductor substrate; and
a second semiconductor substrate over the first semiconductor substrate,
wherein the first semiconductor substrate includes the pixel array, and
wherein the second semiconductor substrate includes the first converter, the second converter, and the first ramp signal generation circuit.

13. The imaging device according to claim 12, further comprising:
a logic circuit that performs processing using a digital signal converted by the first converter and a digital signal converted by the second converter,
wherein the second semiconductor substrate includes the logic circuit, and
wherein the logic circuit is located between the first converter and the second converter in plan view.

14. The imaging device according to claim 1, wherein the pixel array is located between the first converter and the second converter in plan view.

15. A camera comprising:
the imaging device according to claim 1; and
a lens that collects external light onto the pixel array.

16. The imaging device according to claim 1, wherein the first connection line is a first wiring line, and the second connection line is a second wiring line.

17. The imaging device according to claim 1, wherein the third end of the second connection line is directly connected to the second end of the first connection line.

18. The imaging device according to claim 17, wherein the first connection line is a first wiring line, and the second connection line is a second wiring line.

19. An imaging device comprising:
a pixel array having a plurality of pixels two-dimensionally arranged;
a first converter that converts an analog signal output from a pixel of a first group among the plurality of pixels into a digital signal;
a second converter located away from the first converter, the second converter converting an analog signal output from a pixel of a second group among the plurality of pixels into a digital signal; and
a first ramp signal generation circuit located closer to the first converter than to the second converter, the first ramp signal generation circuit supplying a first ramp signal to the first converter and the second converter,
wherein a length of an electrical path from an output terminal of the first ramp signal generation circuit to an input terminal of the first converter is equal to a length of an electrical path from the output terminal of the first ramp signal generation circuit to the input terminal of the second converter.

20. An imaging device comprising:
a pixel array having a plurality of pixels two-dimensionally arranged;
a first converter that converts an analog signal output from a pixel of a first group among the plurality of pixels into a digital signal;
a second converter located away from the first converter, the second converter converting an analog signal output from a pixel of a second group among the plurality of pixels to a digital signal;
a first ramp signal generation circuit located closer to the first converter than to the second converter, the first ramp signal generation circuit supplying a first ramp signal to the first converter and the second converter;
a first connection line having a first end and a second end, the first end being connected to an output terminal of the first ramp signal generation circuit, the first connection line including a portion extending away from an input terminal of the first converter in a path from the first end to the second end; and
a second connection line having a third end and a fourth end, the third end being directly connected to the second end of the first connection line and the fourth end being connected to the input terminal of the first converter, the second connection line including a portion extending closer to the input terminal of the first converter in a path from the third end to the fourth end of the second connection line,
wherein the first connection line is a first wiring line, and the second connection line is a second wiring line.

* * * * *